(12) United States Patent
Tanaka

(10) Patent No.: US 7,522,645 B2
(45) Date of Patent: Apr. 21, 2009

(54) NITRIDE-BASED SEMICONDUCTOR LASER DEVICE

(75) Inventor: Akira Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 11/841,254

(22) Filed: Aug. 20, 2007

(65) Prior Publication Data
US 2008/0069163 A1    Mar. 20, 2008

(30) Foreign Application Priority Data
Sep. 20, 2006    (JP) .............................. 2006-254598

(51) Int. Cl.
*H01S 3/14* (2006.01)
*H01S 3/04* (2006.01)
(52) U.S. Cl. ...................... 372/39; 372/43.01
(58) Field of Classification Search ................... 372/29, 372/43.01, 45.013, 50.1
See application file for complete search history.

(56) References Cited

U.S. PATENT DOCUMENTS

| | | | |
|---|---|---|---|
| 5,569,934 A | 10/1996 | Fujii et al. | |
| 6,377,597 B1 | 4/2002 | Okumura | |
| 6,885,085 B2 | 4/2005 | Kawanishi et al. | |
| 6,956,882 B2 | 10/2005 | Okumura | |
| 7,183,569 B2 | 2/2007 | Okumura | |

FOREIGN PATENT DOCUMENTS

| | | |
|---|---|---|
| DE | 698 34 415 T2 | 11/2006 |
| EP | 0 483 687 A2 | 5/1992 |
| EP | 1 022 825 A1 | 7/2000 |
| JP | 10-256657 | 9/1998 |
| JP | 10-261838 | 9/1998 |
| WO | WO 98/39827 | 9/1998 |

*Primary Examiner*—Armando Rodriguez
(74) *Attorney, Agent, or Firm*—Oblon, Spivak, McClelland, Maier & Neustadt, P.C.

(57) ABSTRACT

A nitride-based semiconductor laser device, includes: a first cladding layer of a first conductivity type; an active layer formed above the first cladding layer; an overflow-preventing layer of a second conductivity type formed on the active layer; and a second cladding layer of the second conductivity type formed above the overflow-preventing layer. The active layer includes three barrier layers and two well layers so that each well layer can be inserted between the corresponding ones of the three barrier layers and two of the three barrier layers are located on the outer sides of both well layers, thereby constituting a double-layered quantum well layer. The thickness of each well layer is set within a range of 2 to 5 nm.

20 Claims, 2 Drawing Sheets

1 n-GaN substrate
2 n-AlGaN cladding layer
3 n-GaN optical guide layer
4 InGaN multilayered quantum well active layer
5 p-AlGaN overflow-preventing layer
6 p-GaN optical guide layer
7 p-AlGaN cladding layer
8 P⁺-GaN contact layer
9 $SiO_2$ insulating layer
10 ridge shaped waveguide
11 p-electrode
12 n-electrode
41 well layer of InGaN multilayered quantum well active layer
42 barrier layer of InGaN multilayered quantum well active layer
51 GaN diffusion-preventing layer

FIG. 1

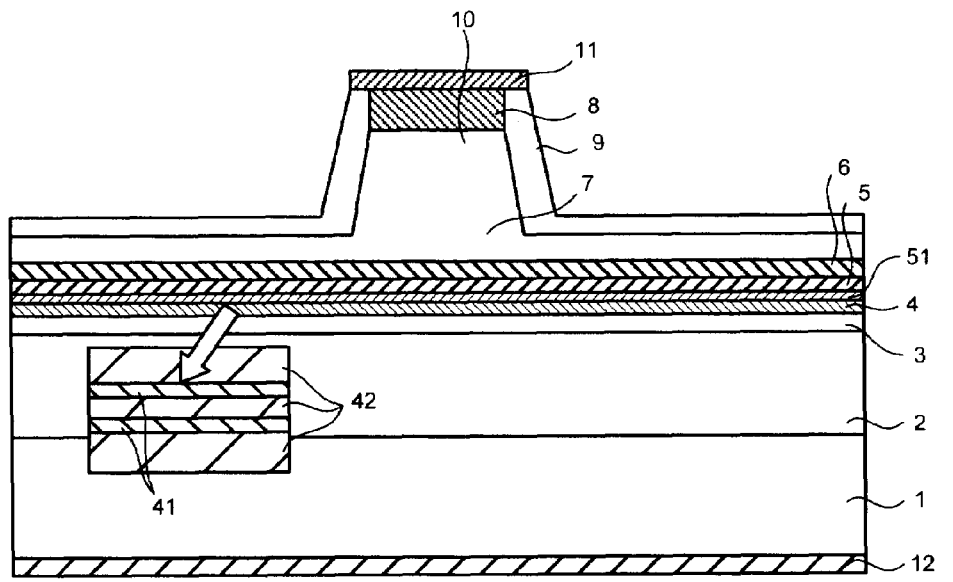

1 n-GaN substrate
2 n-AlGaN cladding layer
3 n-GaN optical guide layer
4 InGaN multilayered quantum well active layer
5 p-AlGaN overflow-preventing layer
6 p-GaN optical guide layer
7 p-AlGaN cladding layer
8 P⁺-GaN contact layer
9 SiO$_2$ insulating layer
10 ridge shaped waveguide
11 p-electrode
12 n-electrode 41 well layer of InGaN multilayered quantum well active layer
42 barrier layer of InGaN multilayered quantum well active layer
51 GaN diffusion-preventing layer

FIG. 2

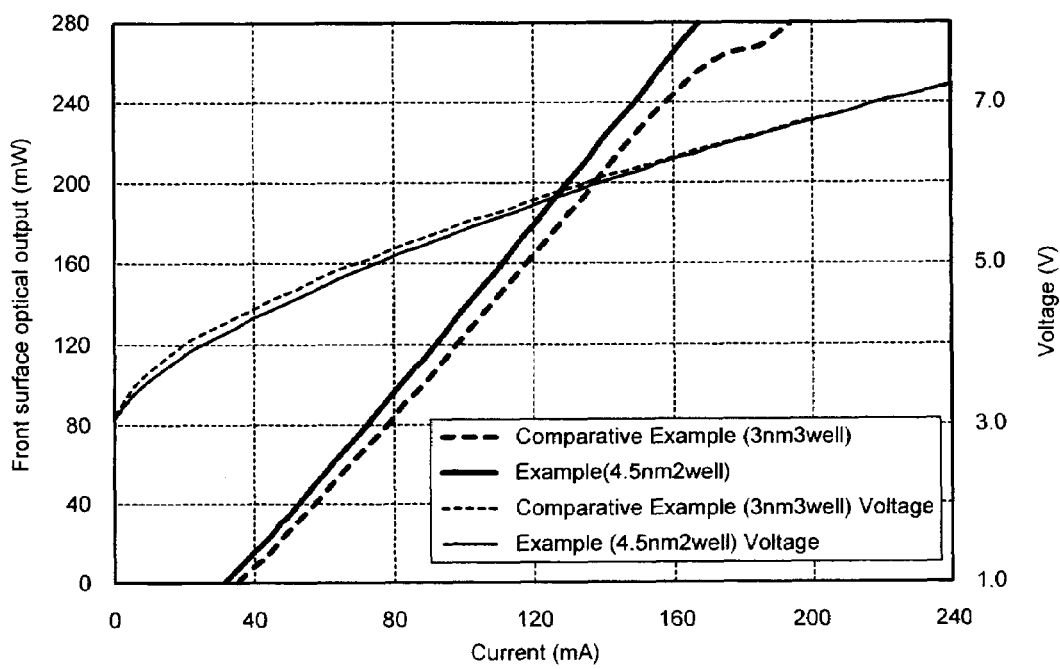

NITRIDE-BASED SEMICONDUCTOR LASER DEVICE

CROSS-REFERENCE TO RELATED APPLICATIONS

This application is based upon and claims the benefit of priority from the prior Japanese Patent Application No. 2006-254598 filed on Sep. 20, 2006; the entire contents which are incorporated herein by reference.

BACKGROUND OF THE INVENTION

1. Field of the Invention

The present invention relates to a nitride-based semiconductor laser device.

2. Description of the Related Art

A blue-violet semiconductor laser device of 400 nm band range is promised for next-generation DVD (digital versatile disk) and the like. The blue-violet semiconductor laser is configured as a ridge-shaped waveguided semiconductor laser device.

Such a blue-violet semiconductor laser device as described above is disclosed in "Reference 1" wherein the active layer is configured as a multilayered quantum well structure. In this case, there are some disadvantages of the increase of the operation voltage, the increase of the Stark effect due to the piezoelectric field and the increase of the threshold voltage.

In this point of view, it is desired that the number of the layers constituting the multilayered quantum well structure is decreased and the thickness of each well layer composing the same multilayered quantum well structure is decreased. In this case, however, the total thickness of the multilayered quantum well structure is decreased so as to cause the overflow of carriers and thus, deteriorate the luminous efficiency. As of now, therefore, in the semiconductor laser device configured such that the active layer is formed as the multilayered quantum well structure, the reduction of the operation voltage and the reduction of the threshold voltage can not be established under the prevention of the overflow of the carriers yet.

In the ridge-shaped waveguided semiconductor laser device as disclosed in Reference 1, in contrast, the multilayered quantum well structure is formed at a lower temperature due to the material compositions thereof and the cladding layer(s) and the optical guide layer are formed at a higher temperature due to the material compositions thereof. Namely, although the multilayered quantum well structure is adjacent to the optical guide layer and/or the cladding layer (s), they can not be formed subsequently in the practical manufacturing process due to the difference in formation temperature therebetween. In this point of view, the multilayered quantum well structure, the optical guide layer and the cladding layer(s) are formed intermittently due to the control in the formation temperature thereof.

As a result, some defects are likely to be formed in the well layers of the multilayered quantum well structure. Moreover, the piezoelectric effect may be generated due to the distortion from the crystal interface so as to cause the distortion of the band structure of the multilayered quantum well structure and thus, disturb the recombination of the carriers, leading to the trouble in luminescence. In addition, the voltage drop occurs at the crystal interface to increase the operation voltage. Moreover, some defects may be enlarged due to the heat generation from the long-term use, leading to the deterioration of the reliability of the multilayered quantum well structure, that is, the ridges-shaped semiconductor laser device.

[Reference 1] JP-A 10-256657 (KOKAI)

BRIEF SUMMARY OF THE INVENTION

An aspect of the present invention relates to a nitride-based semiconductor laser device, including: a first cladding layer of a first conductivity type; an active layer formed above the first cladding layer; an overflow-preventing layer of a second conductivity type formed on the active layer; and a second cladding layer of the second conductivity type formed above the overflow-preventing layer; wherein the active layer includes three barrier layers and two well layers so that each well layer can be inserted between the corresponding ones of the three barrier layers and two of the three barrier layers are located on the outer sides of both well layers, thereby constituting a double-layered quantum well layer; wherein a thickness of each well layer is set within a range of 2 to 5 nm.

BRIEF DESCRIPTION OF THE DRAWINGS

FIG. 1 is a cross-sectional view showing the structure of a nitride-based semiconductor laser device according to an embodiment.

FIG. 2 is a graph showing the relations between the front surface optical output, the voltage and the current in the nitride-based semiconductor laser device when the number of well layer in the multilayered quantum well active layer thereof is defined as a parameter.

DETAILED DESCRIPTION OF THE INVENTION

Figure 3:
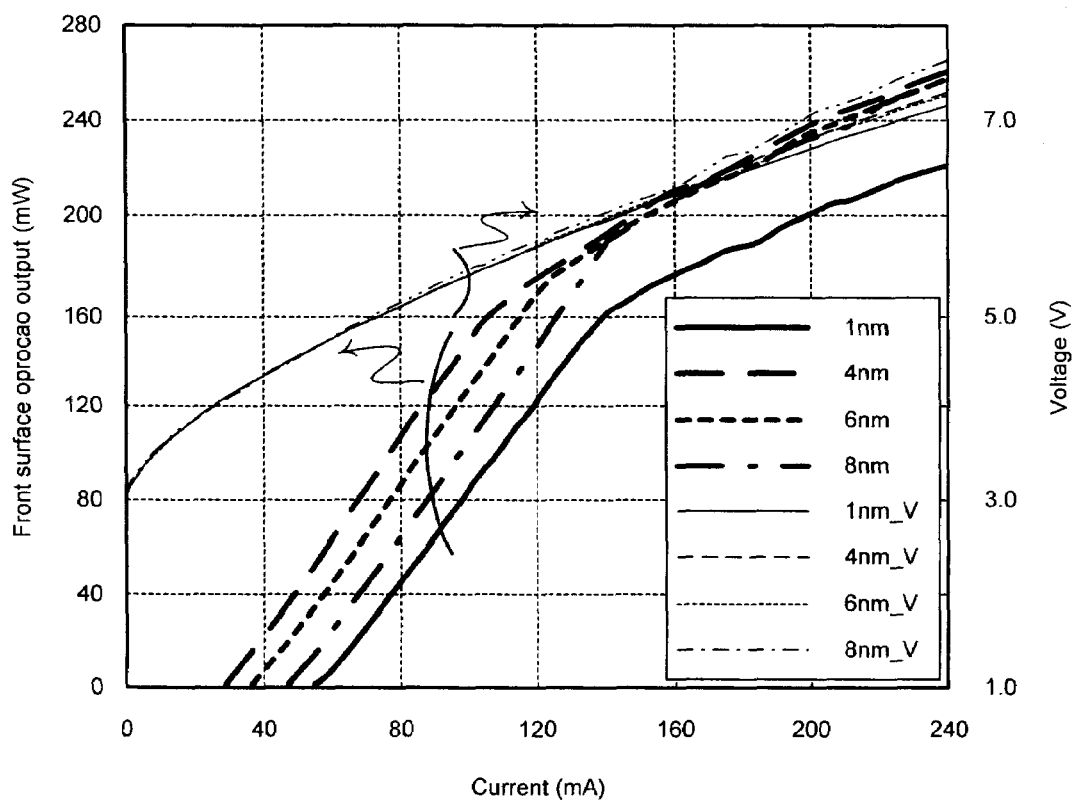
FIG. 3 is a graph showing the relations between the front surface optical output, the voltage and the current in the nitride-based semiconductor laser device when the thickness of each well layer in the multilayered quantum well active layer thereof is defined as a parameter.

Hereinafter, embodiments of the present invention will be described with reference to the drawings. The drawings, though referred to in describing the embodiments of the present invention, are provided only for an illustrative purpose and in no way limit the present invention.

In this embodiment, it is required that the two-layered quantum well layer is configured such that the thickness of each well layer composing the two-layered quantum well layer is set within a range of 2 to 5 nm, preferably within a range of 2 to 4.5 nm, particularly within a range of 2 to 4 nm. In this case, since the thickness of each well layer is sufficiently reduced, the distortion of the band structure of each well layer, which is originated from the piezoelectric effect, is suppressed so as to enhance the recombination between the electrons and the holes. In this point of view, the increase of the threshold current can be sufficiently suppressed.

In this embodiment, moreover, since the two-layered quantum well layer constitutes the active layer of the nitride-based semiconductor laser device, the number of crystal interface can be reduced in the active layer so as to reduce the voltage drop due to the reduction of the number of crystal interface and thus, reduce the increase of the operation voltage.

In this embodiment, in addition, since the overflow-preventing layer is incorporated in the multilayered structure constituting the nitride-based semiconductor laser device, the overflow of the carriers such as the electrons and the holes can be suppressed so as to prevent the reduction in luminescence of the nitride-based semiconductor laser device even though the active layer is configured as the two-layered quantum well layer and the thickness of each well layer is reduced within a range of 2 to 5 nm.

In this embodiment, the two-layered quantum well layer is configured such that each of the two well layers is inserted between the corresponding ones of the three barrier layers. Namely, the two-layered quantum well layer is configured such that each well layer is sandwiched between the corresponding ones of the barrier layers and two of the barrier layers are positioned on the outer side of the well layers, respectively. Therefore, even though the two-layered quantum well layer, the cladding layers, the optical guide layer and the like are intermittently formed at the respective different temperatures on the different material compositions thereof, no crack is formed in the well layers of the two-layered quantum well layer because the barrier layers located on the outer side of the well layers function as protective layers. As a result, the enlargement of crack can be suppressed so that the reliability of the nitride-based semiconductor laser device can not be deteriorated.

Since the barrier layers located on the outer side of the well layers also function as buffer layers, the distortions at the crystal interfaces between the two-layered quantum well layer and the adjacent layers can be suppressed and the distortion of the band structure of the two-layered quantum well layer can be suppressed. As a result, the luminescent failure due to the disturbance of the recombination between the electrons and the holes and the voltage drop at the crystal interfaces can be suppressed so that the disadvantage of the increase of the operation voltage can be avoided.

In an aspect of this embodiment, the active layer is constituted from the unit of $In_xGa_{1-x}N/In_yGa_{1-y}N$ ($0.05 \leq x \leq 1.0$, $0 \leq y \leq 1.0$, $x > y$), and the overflow-preventing layer is constituted from an $Al_tGa_{1-t}N$ ($t > 0.15$) layer, and the second cladding layer is constituted from an $Al_uGa_{1-u}N$ ($0 < u \leq 0.05$) layer. In this case, the overflow of the carriers can be effectively suppressed while the active layer can exhibit the inherent effect/function.

In another aspect of this embodiment, a diffusion-preventing layer of $AlvGal-vN$ ($v < u$) is formed between the active layer and the overflow-preventing layer. In this case, the diffusion of the impurities contained in the overflow-preventing layer into the active layer can be suppressed effectively so as to prevent the non-radiative recombination of the active layer. As a result, the increase of the threshold current can be suppressed effectively.

If a nitride-based semiconductor is configured such that the active layer includes two well layers and one barrier layer as a multilayered quantum well layer, the one barrier layer is sandwiched by the well layers. In this case, since no barrier layer and no buffer layer are formed for the active layer, some defects may be created in the well layers and the distortions at the crystal interfaces between the active layer and the adjacent layers may occur because the active layer of the multi-layered quantum well layer, the cladding layers and the optical guide layer are formed intermittently due to the difference in formation temperature thereof.

Herein, the "nitride-based semiconductor" means a semiconductor made of $(Al_xB_{1-x})_yGa_zIn_{1-y-z}N$ ($0 < x < 1$, $0 < y \leq 1$, $0 \leq z < 1$, $y + z \leq 1$) and as occasion demands, may contain V group element such as As and p, a p-type impurity and an n-type impurity.

With the nitride-based semiconductor element made of the nitride as described above, some defects may be enlarged due to the heat generation during a long-term use so as to deteriorate the reliability of the nitride-based semiconductor element. Moreover, the distortion of the band structure of the two-layered quantum well layer can be suppressed so that the luminescent failure due to the disturbance of the recombination between the electrons and the holes and the voltage drop at the crystal interfaces may occur. In the latter case, the operation voltage is also increased.

FIG. 1 is a cross-sectional view showing the structure of the nitride-based semiconductor laser device according to this embodiment. In the nitride-based semiconductor laser device of this embodiment, as shown in FIG. 1, an n-AlGaN cladding layer 2, an n-GaN optical guide layer 3, an InGaN multilayered quantum well active layer 4, a p-AlGaN overflow-preventing layer 5, a p-GaN optical guide layer 6, a p-AlGaN cladding layer 7 and a $p^+$-GaN contact layer 8 are subsequently formed on an n-GaN substrate 1.

A portion of the p-AlGaN cladding layer 7 is formed in a ridge shape and constitutes a waveguide 10. Then, $SiO_2$ insulating layers 9 are formed at both sides of the ridge-shaped portion of the cladding layer 7. Then, a p-electrode 11 is formed on the $p^+$-GaN contact layer 8 and an n-electrode 12 is formed on the rear surface of the n-GaN substrate 1.

In this way, the nitride-based semiconductor laser device is structured as a double heterostructure-type nitride-based semiconductor laser device. In the nitride-based semiconductor laser device as shown in FIG. 1, the holes are injected from the p-electrode 11 and the electrons are injected from the n-electrode 12 so that the holes and the electrons are recombined in the multilayered quantum well active layer 4, thereby generating a light within a given wavelength range. The thus obtained light is propagated and reflected repeatedly in the ridge shaped waveguide 10 by reflective layers (not shown). Herein, since the ridge shaped waveguide 10 is elongated perpendicular to the page, the light is propagated and reflected on the same direction. In this case, the light is amplified by the corresponding resonance wavelength of the ridge shaped waveguide 10, and taken out of the nitride-based semiconductor laser device as a laser beam.

Since the multilayered quantum well active layer 4 is made of the semiconductor nitride of InGaN and the other layers such as the cladding layers are made of the semiconductor nitride of AlGaN, the laser beam becomes a blue-violet laser beam so that the nitride-based semiconductor laser device can function as a blue-violet semiconductor laser device with a wavelength band range of 400 nm.

As shown in the enlarged view of FIG. 1, the multilayered quantum well active layer 4 is configured such that the two well layers 41 are sandwiched by the corresponding ones of the three barrier layers 42, respectively. Therefore, since the number of the well layer 41 is set to two so that the number of the interface in the multilayered quantum well active layer 4 can be reduced sufficiently, the total voltage to be applied to all of the interfaces of the multilayered quantum well active layer 4 can be also reduced. As a result, the operation voltage of the nitride-based semiconductor laser device can be reduced sufficiently.

Moreover, the multilayered quantum well active layer 4 is configured such that each well layer 41 can be sandwiched by the corresponding ones of the barrier layers 42 and two of the barrier layers 42 are located on the outer sides of both well layers 41, respectively. Therefore, even though the multilayered quantum well active layer 4, the cladding layers 2, 7, the optical guide layer 3 and the like are formed intermittently due to the differences in formation temperature thereof, the barrier layers 42 located on the outer sides of both well layers 41 function as protective layers, respectively, so as to suppress some defects in the well layers 41. In this point of view, the enlargement of the defects due to the heat generation of the multilayered quantum well active layer 4 can be suppressed so that the reliability of the active layer 4, that is, the nitride-based semiconductor laser device can be maintained for the long-term use.

Moreover, since the barrier layers 42 located on the outer sides of both well layers 41 can function as buffer layers, respectively, the distortions at the crystal interfaces between the active layer and the adjacent layers can be suppressed so that the distortion of the band structure of the multilayered quantum well active layer 4 can be suppressed. As a result, the luminescent failure due to the disturbance of the recombination of the carriers and the voltage drop at the interfaces can be suppressed so that the disadvantage of the increase of the operation voltage can be removed.

The well layer 41 and the barrier layer 42 can be formed by controlling the composition of the InGaN nitride. For example, when the In content is increased and the Ga content is decreased, the band gap of the InGaN nitride layer is decreased. In this point of view, the well layer 41 can be formed by increasing the In content and decreasing the Ga content in the InGaN nitride and the barrier layer 42 can be formed by decreasing the In content and increasing the Ga content in comparison with the well layer 41.

In this embodiment, the thickness of each well layer 41 is set within a range of 2 to 5 nm. In this case, since the thickness of each well layer 41 can be reduced sufficiently, the distortion of the well layer due to the piezoelectric effect can be suppressed sufficiently to enhance the recombination between the electrons and the holes. As a result, the threshold current of the nitride-based semiconductor laser device can be reduced, e.g., about 32 mA or below.

The upper limited value of the thickness of the well layer 41 is preferably set to 4.5 nm, particularly to 4 nm. The reduction of the upper limited value of the thickness of the well layer 41 can decrease the threshold current to about 29 mA or below, particularly to about 28 mA or below, for example (refer to FIG. 3 in Examples).

If the thickness of the well layer 41 is set beyond 5 nm or less than 2 nm, the threshold current is remarkably increased. For example, if the thickness of the well layer 41 is set to 6 nm, the threshold current is increased to about 40 mA. In this point of view, it is required that the thickness of the well layer 41 is set within a range of 2 to 5 nm, preferably a range of 2 to 4.5 nm, particularly a range of 2 to 4 nm (refer to FIG. 3 in Examples).

In this embodiment, the number of the well layer 41 composing the multilayered quantum well active layer 4 is set to two and the thickness of each well layer 41 is set within a range of 2 to 5 nm. In this point of view, the overflow of the carriers may occur due to the small total thickness of the multilayered quantum well active layer 4. In this embodiment, however, since the overflow-preventing layer 5 is formed in the vicinity of the multilayered quantum well active layer 4, the overflow of the carriers from the multilayered quantum well active layer 4 can be effectively suppressed.

As described above, when the multilayered quantum well active layer 4 is made of the InGaN nitride, the multilayered quantum well active layer 4 is formed from the unit of $In_xGa_{1-x}N/In_yGa_{1-y}N$ ($0.05 \leq x \leq 1.0$, $0 \leq y \leq 1.0$, $x>y$) and the overflow-preventing layer 5 is formed from the $Al_tGa_{1-t}N$ ($t>0.15$) layer. In the unit of $In_xGa_{1-x}N/In_yGa_{1-y}N$, the former nitride $In_xGa_{1-x}N$ corresponds to the well layer and the latter nitride $In_yGa_{1-y}N$ corresponds to the barrier layer. In this case, the overflow of the carriers can be effectively suppressed by the overflow-preventing layer 5 while the multilayered quantum well active layer 4 can exhibit the inherent effect/function.

In the case that the multilayered quantum well active layer 4 is formed from the unit of $In_xGa_{1-x}N/In_yGa_{1-y}N$ ($0.05 \leq x \leq 1.0$, $0 \leq y \leq 1.0$, $x>y$) and the overflow-preventing layer 5 is formed from the $Al_tGa_{1-t}N$ ($t>0.15$) layer, the p-AlGaN cladding layer is formed from the $Al_uGa_{1-u}N$ ($0<u \leq 0.05$) layer so as to be functioned as the ridge-shaped waveguide 10 sufficiently.

If the multilayered quantum well active layer 4, the overflow-preventing layer 5 and the p-type cladding layer 7 are formed from the corresponding nitride materials as described above, the nitride-based semiconductor laser device can effectively exhibit the inherent function of the blue-violet semiconductor laser device of the 400 nm wavelength range.

In the nitride-based semiconductor laser device as shown in FIG. 1, a GaN diffusion-preventing layer 51 is formed between the multilayered quantum well active layer 4 and the p-AlGaN overflow-preventing layer 5. In this case, the diffusion of the impurities contained in the p-AlGaN overflow-preventing layer 5 into the multilayered quantum well active layer 4 can be suppressed so as to prevent the non-radiative recombination. As a result, the increase of the threshold current can be effectively suppressed.

Herein, the diffusion-preventing layer 51 may be made of AlvGa1-vN (v<u) so that the composition of AlvGa1-vN can be changed in view of the material compositions of the multilayered quantum well active layer 4 and the overflow-preventing layer 5, and the effective diffusion-preventing function of the layer 51.

EXAMPLES

In this Example, the nitride-based semiconductor laser device was fabricated by defining the material compositions of the constituent layers and the thicknesses of the constituent layers and various properties were investigated on simulation.

As shown in FIG. 1, an n-$Al_{0.04}Ga_{0.96}N$ cladding layer 2 (thickness: 0.5 to 2 μm), an n-GaN optical guide layer 3 (thickness: 0.01 to 0.1 μm), an $In_{0.13}Ga_{0.87}N/In_{0.01}Ga_{0.99}N$ multilayered quantum well active layer 4 (thickness: 0.5 to 2 μm), a GaN diffusion-preventing layer 51 (thickness: 0.01 to 0.1 μm), a p$^+$-$Al_{0.2}Ga_{0.8}N$ overflow-preventing layer 5 (thickness: 5 to 20 nm), a p-GaN optical guide layer 6 (thickness: 0.01 to 0.1 μm), a p-$Al_{0.04}Ga_{0.96}N$ cladding layer 7 (thickness: 0.3 to 0.45 μm) and a p$^+$-GaN contact layer 8 (thickness: 0.02 to 0.2 μm) were subsequently formed on an n-GaN substrate 1.

FIG. 2 is a graph showing the relations between the front surface optical output, the voltage and the current in the nitride-based semiconductor laser device when the number of well layer in the multilayered quantum well active layer 4 thereof is defined as a parameter. In Example, the number of the well layer 41 was set to two and the thickness of each well layer 41 was set to 4.5 nm. In Comparative Example, the number of the well layer 41 was set to three beyond the scope of the invention and the thickness of each well layer 41 was set to 3 nm.

It is apparent from FIG. 2 that the voltage in Example is smaller than the voltage in Comparative Example at the same current value and the front surface optical output in Example is almost equal to the front surface optical output in Comparative Example at the same current value. As a result, the operation voltage of the nitride-based semiconductor laser device in Example becomes smaller than the operation voltage of the nitride-based semiconductor laser device in Comparative Example because the number of the well layer 41 is set to two in Example and the number of the well layer 41 is set to three in Comparative Example.

FIG. 3 is a graph showing the relations between the front surface optical output, the voltage and the current in the nitride-based semiconductor laser device when the thickness of each well layer in the multilayered quantum well active layer 4 thereof is defined as a parameter. In this case, the number of the well layer 41 of the multilayered quantum well active layer 4 was set to two and the resultant graph was obtained on simulation. It is apparent from FIG. 3 that the multilayered quantum well active layer has the almost same voltage at the same current value as the thickness of the well layer in the multilayered quantum well active layer is varied within a range of 1 to 8 nm. In contrast, it is turned out that the multilayered quantum well active layer has the different front surface optical outputs at the same current value as the thickness of the well layer is varied within a current range below about 120 mA. Concretely, the front surface optical output is increased as the thickness of the well layer 41 is increased to 8 nm through 6 nm from 4 nm and decreased as the thickness of the well layer 41 is decreased to 1 nm from 4 nm within the current range below about 120 mA.

Namely, when the thickness of the well layer 41 of the multilayered quantum well active layer 4 is varied within a range of 1 to 8 nm, the thus obtained current-voltage characteristics become constant and the thus obtained voltage-front surface optical output characteristics become different because the current-voltage characteristics become constant. Concretely, as described above, since the front surface optical output is increased as the thickness of the well layer 41 is increased to 8 nm through 6 nm from 4 nm and decreased as the thickness of the well layer 41 is decreased to 1 nm from 4 nm within the current range below about 120 mA, the front surface optical output is increased at the same voltage as the thickness of the well layer 41 is increased to 8 nm through 6 nm from 4 nm and decreased as the thickness of the well layer 41 is decreased to 1 nm from 4 nm within the current range below about 120 mA.

In other words, it is turned out that when the thickness of the well layer 41 is varied within a range of 1 to 8 nm under the condition that the number of the well layer 41 is set to two, the voltage to be required to obtain the same front surface optical output, that is, the operation voltage can be reduced within a thickness range of the well layer of 2 to 5 nm.

In FIGS. 2 and 3, although the number of the well layer is decreased to two from three and the thickness of each well layer is set within a range of 2 to 5 nm (particularly 4 nm), the resultant nitride-based semiconductor laser device can exhibit a higher front surface optical output by the p$^+$-Al$_{0.2}$Ga$_{0.8}$N overflow-preventing layer 5. Namely, when the number of the well layer 41 is decreased to two from three and the thickness of each well layer is decreased to 1 nm from 8 nm, the front surface optical output of the nitride-based semiconductor laser device is decreased inherently due to the overflow of the carriers. As shown in FIGS. 2 and 3, however, since the p$^+$-Al$_{0.2}$Ga$_{0.8}$N overflow-preventing layer 5 is provided, the overflow of the carriers can be suppressed effectively so as to realize the higher front surface optical output of the nitride-based semiconductor laser device only within the thickness range of the well layer 41 of 2 to 5 nm.

Moreover, since the GaN diffusion-preventing layer 51 is provided, the diffusion of the impurities contained in the p$^+$-Al$_{0.2}$Ga$_{0.8}$N overflow-preventing layer 5 into the multilayered quantum well active layer 4 can be suppressed effectively so as to realize the higher front surface optical output of the nitride-based semiconductor laser device through the suppression of the non-radiative recombination.

Figure 4:
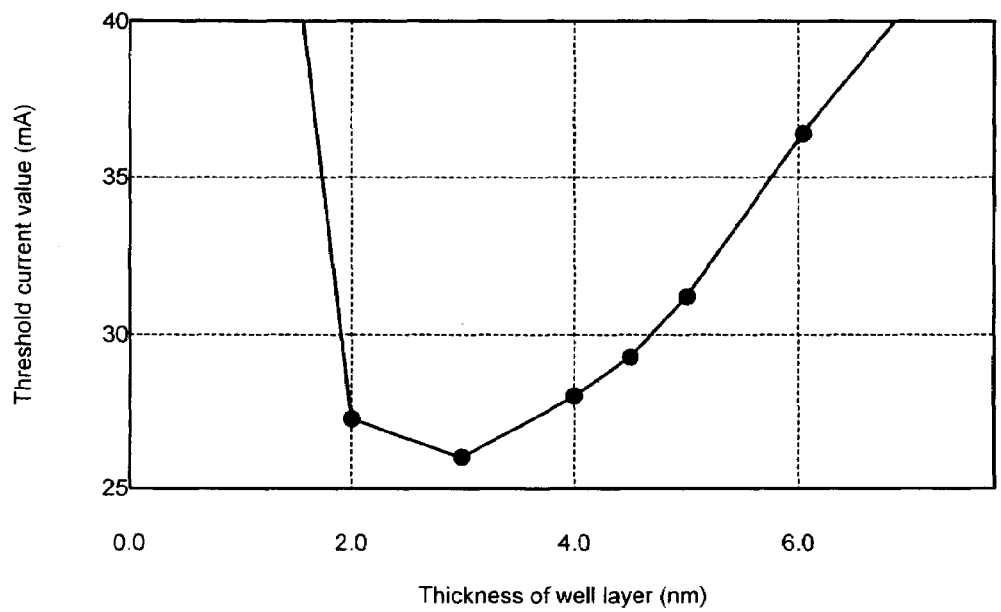
FIG. 4 is a graph showing the relations between the threshold voltage and the thickness of each well layer in the multilayered quantum well active layer of the nitride-based semiconductor laser device.

FIG. 4 is a graph showing the relations between the threshold voltage and the thickness of each well layer in the multilayered quantum well active layer 4 of the nitride-based semiconductor laser device when the number of the well layer 41 is set to two. As is apparent from FIG. 4, the threshold current is set within a range of about 32 mA or below when the thickness of the well layer 41 is set within the range of 2 to 5 nm. Then, the threshold current is set within a range of about 29 mA or below when the thickness of the well layer 41 is set to 4.5 nm or below. Then, the threshold current is set within a range of about 28 mA or below when the thickness of the well layer 41 is set to 4 nm or below.

Although the present invention was described in detail with reference to the above examples, this invention is not limited to the above disclosure and every kind of variation and modification may be made without departing from the scope of the present invention.

In the above-described embodiment, the substrate of the nitride-based semiconductor laser device is made of n-GaN and the n-electrode is formed directly on the rear surface of the substrate. Instead of the n-GaN, however, the substrate may be made of sapphire or SiC. Alternatively, another n-type contact layer is provided in the double-heterostructure nitride-based semiconductor laser device and then, partially exposed so that the n-type electrode can be formed on the exposed portion of the n-type contact layer.

In the embodiment relating to FIG. 1, the top side from the multilayered quantum well active layer 4 is constituted as a p-type multilayered structure and the bottom side from the multilayered quantum well active layer 4 is constituted as an n-type multilayered structure, but may be vice versa.

What is claimed is:

1. A nitride-based semiconductor laser device, comprising:
a first cladding layer of a first conductivity type;
an active layer formed above said first cladding layer;
an overflow-preventing layer of a second conductivity type formed on said active layer; and
a second cladding layer of said second conductivity type formed above said overflow-preventing layer,
wherein said active layer includes three barrier layers and two well layers so that each well layer can be inserted between the corresponding ones of said three barrier layers and two of said three barrier layers are located on the outer sides of both well layers, thereby constituting a double-layered quantum well layer; and
wherein a thickness of each well layer is set within a range of 2 to 5 nm.

2. The laser device as set forth in claim 1,
wherein said thickness of each well layer is set within a range of 2 to 4.5 nm.

3. The laser device as set forth in claim 2,
wherein said thickness of each well layer is set within a range of 2 to 4 nm.

4. The laser device as set forth in claim 1,
wherein said two of said three barrier layers located on the outer sides of both well layers function as protective layers for said well layers, respectively.

5. The laser device as set forth in claim 1,
wherein said two of said three barrier layers located on the outer sides of both well layers function as buffer layers for said active layer, respectively.

6. The laser device as set forth in claim 1,
wherein a portion of second cladding layer constitutes a ridge-shaped waveguide.

7. The laser device as set forth in claim 6,
wherein a light generated from said active layer is amplified in said ridge-shaped waveguide at a resonance frequency of said ridge-shaped waveguide.

8. The laser device as set forth in claim 1, further comprising a first electrode of said first conductivity type formed on a rear surface of a substrate located below said first cladding layer and a second electrode of said second conductivity type formed above said second cladding layer so that said nitride-based semiconductor laser device constitutes a double heterostructure-type nitride-based semiconductor laser device.

9. The laser device as set forth in claim 1,
wherein said nitride-based semiconductor laser device functions as a blue-violet semiconductor laser device with a wavelength band range of 400 nm.

10. The laser device as set forth in claim 1,
wherein said active layer is constituted from a unit of $In_xGa_{1-x}N/In_yGa_{1-y}N$ ($0.05 \leq x \leq 1.0$, $0 \leq y \leq 1.0$, $x>y$).

11. The laser device as set forth in claim 10,
wherein said overflow-preventing layer is constituted from an $Al_tGa_{1-t}N$ ($t>0.15$) layer.

12. The laser device as set forth in claim 10,
wherein said second cladding layer is constituted from an $Al_uGa_{1-u}N$ ($0 \leq u \leq 0.05$) layer.

13. The laser device as set forth in claim 1, further comprising a diffusion-preventing layer between said active layer and said overflow-preventing layer.

14. The laser device as set forth in claim 12, further comprising a diffusion-preventing layer between said active layer and said overflow-preventing layer,
wherein said diffusion-preventing layer is made of $Al_vGa_{1-v}N$ ($v<u$).

15. The laser device as set forth in claim 1, further comprising a first optical guide layer of said first conductivity type between said first cladding layer and said active layer.

16. The laser device as set forth in claim 1, further comprising a second optical guide layer of said second conductivity type between said second cladding layer and said active layer.

17. The laser device as set forth in claim 13, further comprising a first optical guide layer of said first conductivity type between said first cladding layer and said active layer.

18. The laser device as set forth in claim 13, further comprising a second optical guide layer of said second conductivity type between said second cladding layer and said active layer.

19. The laser device as set forth in claim 15,
wherein said first optical guide layer is made of GaN-based nitride.

20. The laser device as set forth in claim 16,
wherein said second optical guide layer is made of GaN-based nitride.

* * * * *